United States Patent
Minamisawa et al.

(10) Patent No.: US 10,356,292 B2
(45) Date of Patent: Jul. 16, 2019

(54) OPTICAL UNIT WITH ROLLING CORRECTION FUNCTION AND OPTICAL UNIT WITH TRIAXIAL SHAKE CORRECTION FUNCTION

(71) Applicant: NIDEC SANKYO CORPORATION, Nagano (JP)

(72) Inventors: Shinji Minamisawa, Nagano (JP); Masato Gomyo, Nagano (JP); Takeshi Sue, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 0 days.

(21) Appl. No.: 16/027,239

(22) Filed: Jul. 3, 2018

(65) Prior Publication Data

US 2019/0020799 A1 Jan. 17, 2019

(30) Foreign Application Priority Data

Jul. 12, 2017 (JP) ................................. 2017-136036

(51) Int. Cl.
   *H04N 5/225* (2006.01)
   *H05K 1/18* (2006.01)
   *H05K 1/02* (2006.01)
   *H04N 5/232* (2006.01)

(52) U.S. Cl.
   CPC ....... *H04N 5/22521* (2018.08); *H04N 5/2253* (2013.01); *H04N 5/2254* (2013.01); *H04N 5/2328* (2013.01); *H05K 1/0203* (2013.01); *H05K 1/181* (2013.01); *H05K 1/0209* (2013.01); *H05K 2201/066* (2013.01); *H05K 2201/10121* (2013.01); *H05K 2201/10151* (2013.01)

(58) Field of Classification Search
   None
   See application file for complete search history.

(56) References Cited

U.S. PATENT DOCUMENTS

2009/0148150 A1* 6/2009 Valles Navarro .... F16M 11/041
                                                                    396/428
2016/0216528 A1* 7/2016 Asakawa ............. G02B 27/646

FOREIGN PATENT DOCUMENTS

JP         2008131251          6/2008

* cited by examiner

*Primary Examiner* — James M Hannett
(74) *Attorney, Agent, or Firm* — JCIPRNET

(57) ABSTRACT

An optical unit with rolling correction function is provided and performs rolling correction by fixing a circuit board on which an imaging element is mounted and a heat dissipating member to a rotation member, transmitting heat from the circuit board to the heat dissipating member, and rotating the rotation member. A rotation shaft of a rotation supporting mechanism is fixed to the rotation member via the heat dissipating member. Accordingly, it is possible to dissipate heat by transmitting heat that is generated from the imaging element, from the circuit board to the heat dissipating member, and then transmitting the heat from the heat dissipating member to the rotation shaft. The imaging element and the heat dissipating member overlap with the rotation shaft at an identical position when the imaging element and the heat dissipating member are seen from an optical axis direction.

13 Claims, 11 Drawing Sheets

OPTICAL UNIT WITH ROLLING CORRECTION FUNCTION AND OPTICAL UNIT WITH TRIAXIAL SHAKE CORRECTION FUNCTION

CROSS REFERENCE TO RELATED APPLICATION

The present application claims priority under 35 U.S.C. § 119 to Japanese Application No. 2017-136036 filed Jul. 12, 2017, the entire content of which is incorporated herein by reference.

TECHNICAL FIELD

The present disclosure relates to an optical unit with shake correction function that corrects shake on an optical axis.

DESCRIPTION OF THE RELATED DOCUMENTS

Some optical units that are mounted on a cellular phone or a mobile object include a mechanism, which causes an optical module to swing or rotate in order to correct shake, so as to reduce jitter in a captured image, which is caused upon movement of the cellular phone or the mobile object. An optical unit of this type includes a swing mechanism which causes an optical module to swing in a pitching (i.e., vertical swing/tilting) direction and in a yawing (i.e., transverse swing/panning) direction in accordance with tilt in the pitching direction and tilt in the yawing direction. The optical unit also includes a rolling correction mechanism which causes the optical module to rotate on an optical axis in accordance with shake on an optical axis.

In an optical unit including an imaging element, there has been suggestion of a heat dissipating structure that dissipates heat generated from the imaging element. Patent Literature 1 discloses a structure in that a heat dissipating ceramic is sandwiched between a CCD and a supporting plate.

[Patent Literature 1] Japanese Unexamined Patent Application Publication No. 2008-131251

An optical unit equipped with an imaging element has a problem in that an amount of heat generated from the imaging element increases owing to the increased number of pixels in the imaging element. Therefore, it has been required to provide a configuration capable of efficiently dissipating the heat generated from the imaging element.

In view of the above problem, at least an embodiment of the present disclosure efficiently dissipates heat generated from an imaging element in an optical unit that corrects shake on an optical axis.

SUMMARY

To solve the above problem, an optical unit with rolling correction function according to at least an embodiment of the present disclosure includes: an optical element; an imaging element that is arranged on a counter object side of the optical element; a rotation member to which a circuit board and a heat dissipating member are fixed, wherein the circuit board is mounted with the imaging element, and the heat dissipating member is arranged on the counter object side of the circuit board to receive a heat from the circuit board; a fixation member that is arranged on the counter object side of the rotation member; a rotation supporting mechanism that includes a rotation shaft fixed to the rotation member via the heat dissipating member, and a bearing part provided on the fixation member; and a rolling magnetic driving mechanism that causes the rotation member to rotate on an optical axis of the optical element. At least a part of the imaging element and at least a part of the heat dissipating member overlap with the rotation shaft at an identical position when the imaging element and the heat dissipating member are seen from an optical axis direction.

According to at least an embodiment of the present disclosure, the circuit board on which the imaging element is mounted and the heat dissipating member to which the heat from the circuit board is transmitted are fixed to the rotation member supported by the rotation supporting mechanism, such that the rotation member is able to rotate, in order to perform rolling correction. Furthermore, the rotation shaft of the rotation supporting mechanism is fixed to the rotation member via the heat dissipating member. It is accordingly possible to dissipate heat from the rotation shaft by transmitting heat that is generated from the imaging element, from the circuit board to the heat dissipating member, and then transmitting the heat from the heat dissipating member to the rotation shaft. Furthermore, the imaging element and the heat dissipating member overlap with the rotation shaft at the identical position when the imaging element and the heat dissipating member are seen from the optical axis direction. It is accordingly possible to transmit heat that is generated from the imaging element, to the rotation shaft in the shortest route via the circuit board and the heat dissipating member, and it is therefore possible to efficiently dissipate the heat generated from the imaging element.

In at least an embodiment of the present disclosure, it is preferable that the circuit board is in contact with the heat dissipating member via a heat conductive layer. In the above way, it is possible to efficiently dissipate heat from the circuit board to the heat dissipating member by means of the heat conductive layer. It is accordingly possible to efficiently dissipate heat generated from the imaging element.

In at least an embodiment of the present disclosure, it is preferable that the rotation shaft includes a fixation part that is fixed to the heat dissipating member, and a shaft part that extends from the fixation part toward the counter object side, and the fixation part includes a projection part that is inserted into a through hole or a depression part in the heat dissipating member, and an abutting part that is abutted against the heat dissipating member from the counter object side on an outer circumferential side of the projection part. In the above way, it is possible to provide a site where the rotation shaft is in contact with the heat dissipating member in the optical axis direction, and it is therefore possible to increase an amount of heat dissipated. It is also preferable that the abutting part is a flange part that is larger in diameter than the shaft part. In the above way, it is possible to enlarge a contact area, and it is therefore possible to increase an amount of heat dissipated.

Alternatively, the rotation shaft may include an abutting part that is abutted against the heat dissipating member from an object side, and a shaft part that extends to the counter object side of the heat dissipating member through a through hole in the heat dissipating member. Also in the above way, it is possible to enlarge a contact area between the rotation shaft and the heat dissipating member, and it is therefore possible to increase an amount of heat dissipated.

In at least an embodiment of the present disclosure, it is preferable that at least one of the rotation shaft and the rotation member is a filler-containing resin member. In the above way, it is possible to improve the heat conductivity of at least one of the rotation shaft and the rotation member. It is accordingly possible to increase an amount of heat dissipated. It is also possible to enhance the strength of at least one of the rotation member and the rotation shaft.

In at least an embodiment of the present disclosure, it is preferable that an outer circumferential end portion of the heat dissipating member has an exposed part that is exposed from the rotation member and the circuit board. In the above way, it is possible to dissipate heat from the outer circumferential end portion of the heat dissipating member, and it is therefore possible to efficiently dissipate heat generated from the imaging element.

In at least an embodiment of the present disclosure, it is preferable that the circuit board is in a polygonal shape, the heat dissipating member has a plurality of sides respectively extending along sides of the circuit board, and the exposed part is provided on each side of the heat dissipating member. In the above way, it is possible to dissipate heat from all the sides of the heat dissipating member, and it is therefore possible to evenly dissipate the heat from all the sides.

In at least an embodiment of the present disclosure, it is preferable that the heat dissipating member is larger than the imaging element when the heat dissipating member is seen from the optical axis direction. In the above way, it is possible to easily superimpose the heat dissipating member on a heat generation position of the imaging element. It is accordingly possible to easily dissipate heat.

In at least an embodiment of the present disclosure, it is preferable that the heat dissipating member includes a heat dissipating member main body that extends parallelly to the circuit board, and a protrusion part that extends from an outer circumferential edge of the heat dissipating member main body toward the counter object side. In the above way, it is possible to dissipate heat from the protrusion part. It is also possible to use the protrusion part as a fixation part for a flexible printed circuit board, and it is therefore possible to achieve increase in amount of heat dissipated and simplification of a structure for fixation of the flexible printed circuit board.

In at least an embodiment of the present disclosure, the rolling magnetic driving mechanism includes a coil that is fixed to one of the rotation member and the fixation member on an outer circumferential side of the rotation shaft, and a magnet that is fixed to the other one of the rotation member and the fixation member and is opposed to the coil in the optical axis direction. In the above way, it is possible to configure the rolling magnetic driving mechanism between the rotation member and the fixation member on the outer circumferential side of the rotation shaft. It is accordingly possible to achieve reduction in space for the rolling magnetic driving mechanism.

Next, an optical unit with triaxial shake correction function according to at least an embodiment of the present disclosure includes: the above-described optical unit with rolling correction function; and a shake correction mechanism that corrects shake on an axis orthogonal to the optical axis of the optical unit with rolling correction function. In the above way, it is possible to efficiently dissipate heat generated from the imaging element in the optical unit with triaxial shake correction function.

In this case, it is preferable that the shake correction mechanism is a swing magnetic driving mechanism that causes the optical unit with rolling correction function to swing on a first axis and a second axis orthogonal to the optical axis, and the optical unit with rolling correction function is supported by a gimbal mechanism including a swing supporting part that is arranged at an angular position between the first axis and the second axis, and a movable frame that is supported by the swing supporting part. In the above way, it is possible to arrange the swing supporting part of the gimbal mechanism on the space of the angular position where the swing magnetic driving mechanism is arranged. It is accordingly possible to downsize the optical unit with triaxial shake correction function. Furthermore, since the rotation supporting mechanism for the rolling correction is directly fixed to the member of the optical unit with rolling correction function, the member configuring a part of the gimbal mechanism, an intersection of two axes (i.e., the first axis and the second axis) orthogonal to the optical axis is easily aligned with the rotation shaft for the rolling correction. Furthermore, the optical unit with rolling correction function has a structure in that the rotation shaft for the rolling correction is easily aligned with the center of the imaging element. It is accordingly possible to reduce chipping of an image due to a misalignment between the rotation shaft and the center of the imaging element.

According to at least an embodiment of the present disclosure, the circuit board on which the imaging element is mounted and the heat dissipating member to which the heat from the circuit board is transmitted are fixed to the rotation member supported by the rotation supporting mechanism such that the rotation member is able to rotate, in order to perform rolling correction. Furthermore, the rotation shaft of the rotation supporting mechanism is fixed to the rotation member via the heat dissipating member. It is accordingly possible to dissipate heat from the rotation shaft by transmitting heat that is generated from the imaging element, from the circuit board to the heat dissipating member, and then transmitting the heat from the heat dissipating member to the rotation shaft. Furthermore, the imaging element and the heat dissipating member overlap with the rotation shaft at the identical position when the imaging element and the heat dissipating member are seen from the optical axis direction. It is accordingly possible to transmit heat that is generated from the imaging element, to the rotation shaft in the shortest route via the circuit board and the heat dissipating member, and it is therefore possible to efficiently dissipate the heat generated from the imaging element.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DESCRIPTION OF EMBODIMENTS

The following description explains embodiments of an optical unit 1 with rolling correction function and an optical unit 100 with triaxial shake correction function including the optical unit 1 with rolling correction function, to which at least an embodiment of the present disclosure is applied, with reference to the drawings. In the present specification, with respect to an optical axis L of the optical unit 1 with rolling correction function, an L1 direction is defined as an object side in the optical axis L direction, and an L2 direction is defined as a counter object side in the optical axis L direction.

(Optical Unit with Triaxial Shake Correction Function)

Figure 1:
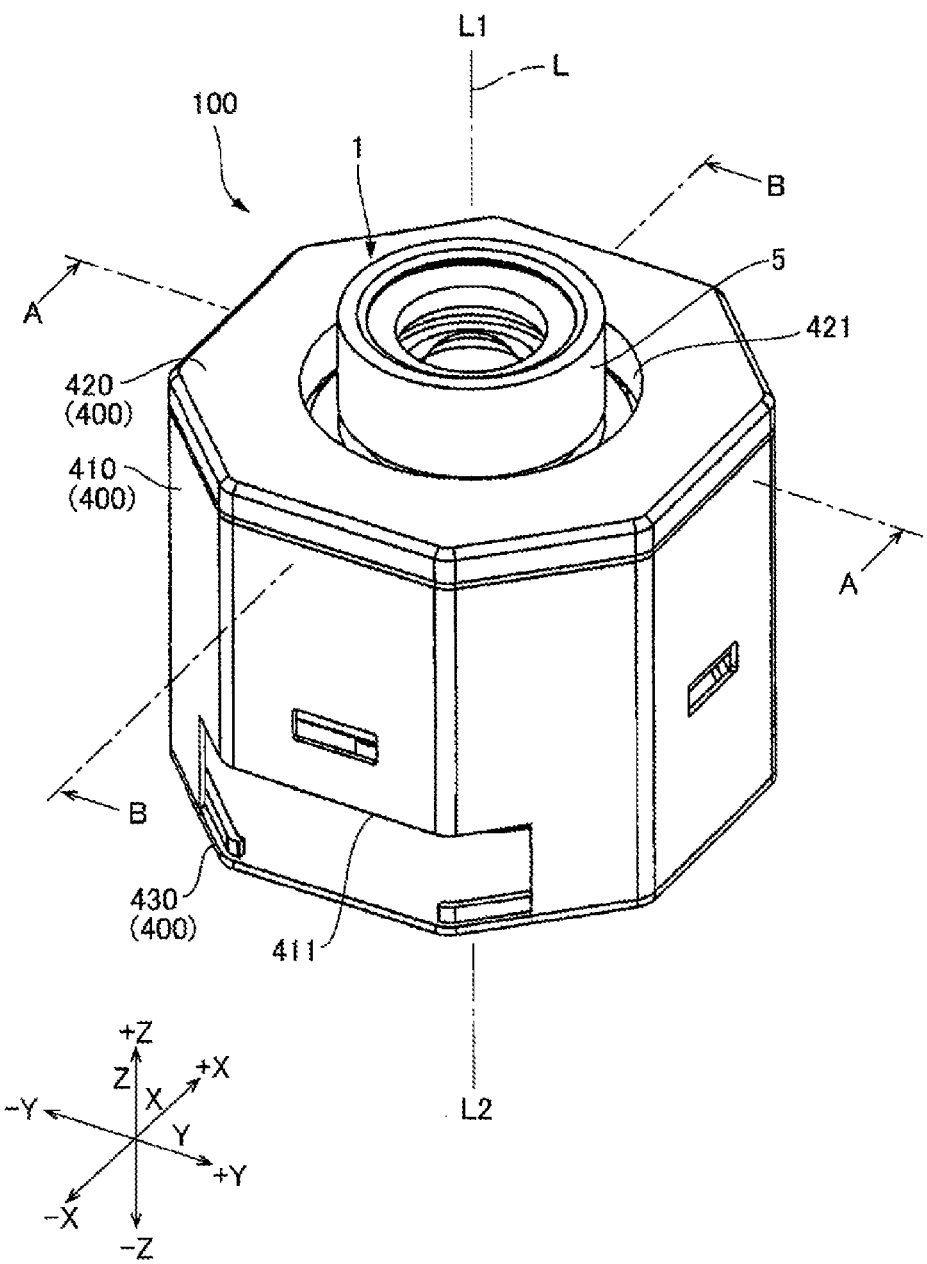
FIG. 1 is an external perspective view of an optical unit with triaxial shake correction function to which at least an embodiment of the present disclosure is applied.
Figure 2:
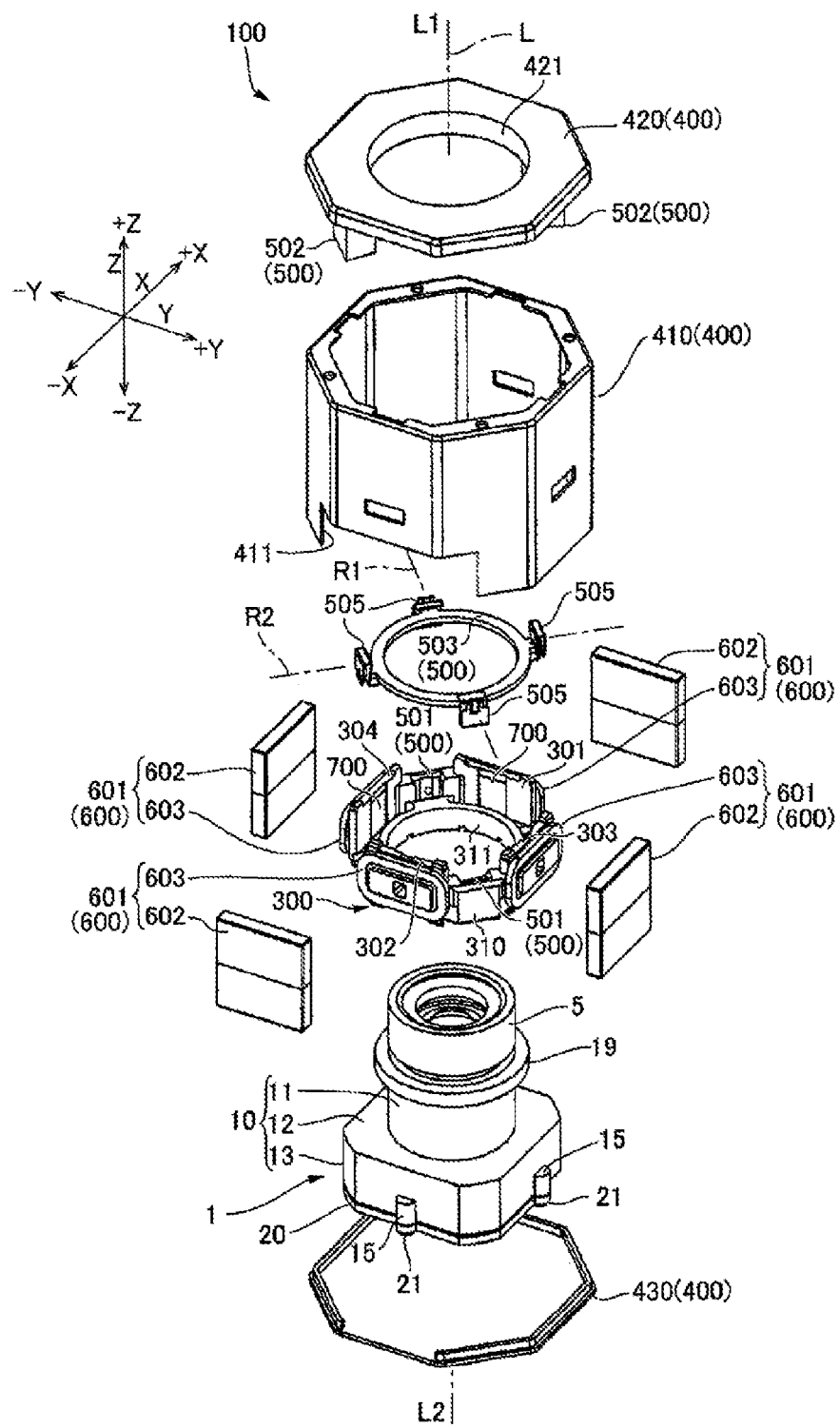
FIG. 2 is an exploded perspective view of the optical unit with triaxial shake correction function of FIG. 1.
Figure 3:
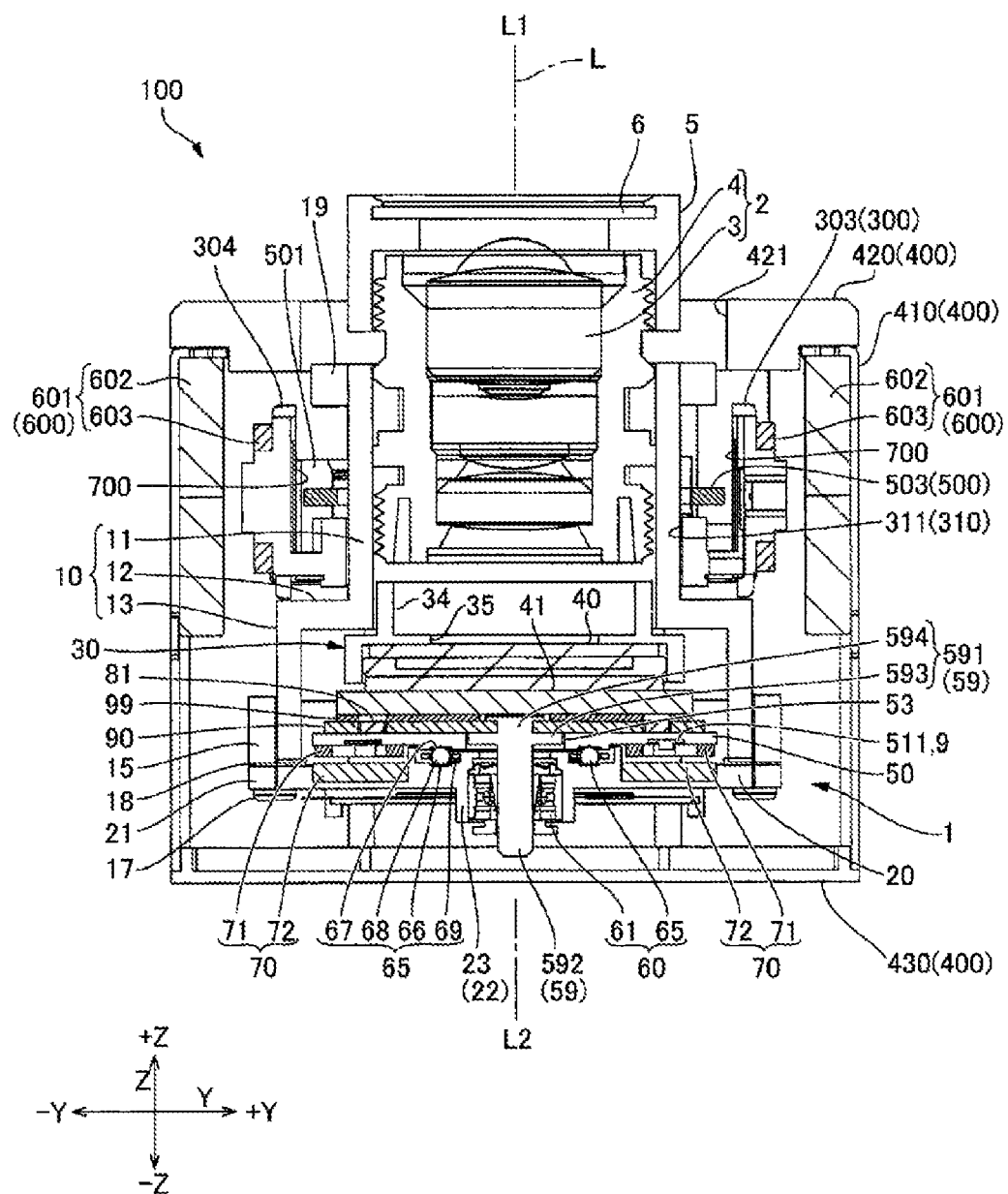
FIG. 3 is a cross-sectional view (i.e., a cross-sectional view taken along a line A-A) of the optical unit with triaxial shake correction function of FIG. 1.
Figure 4:
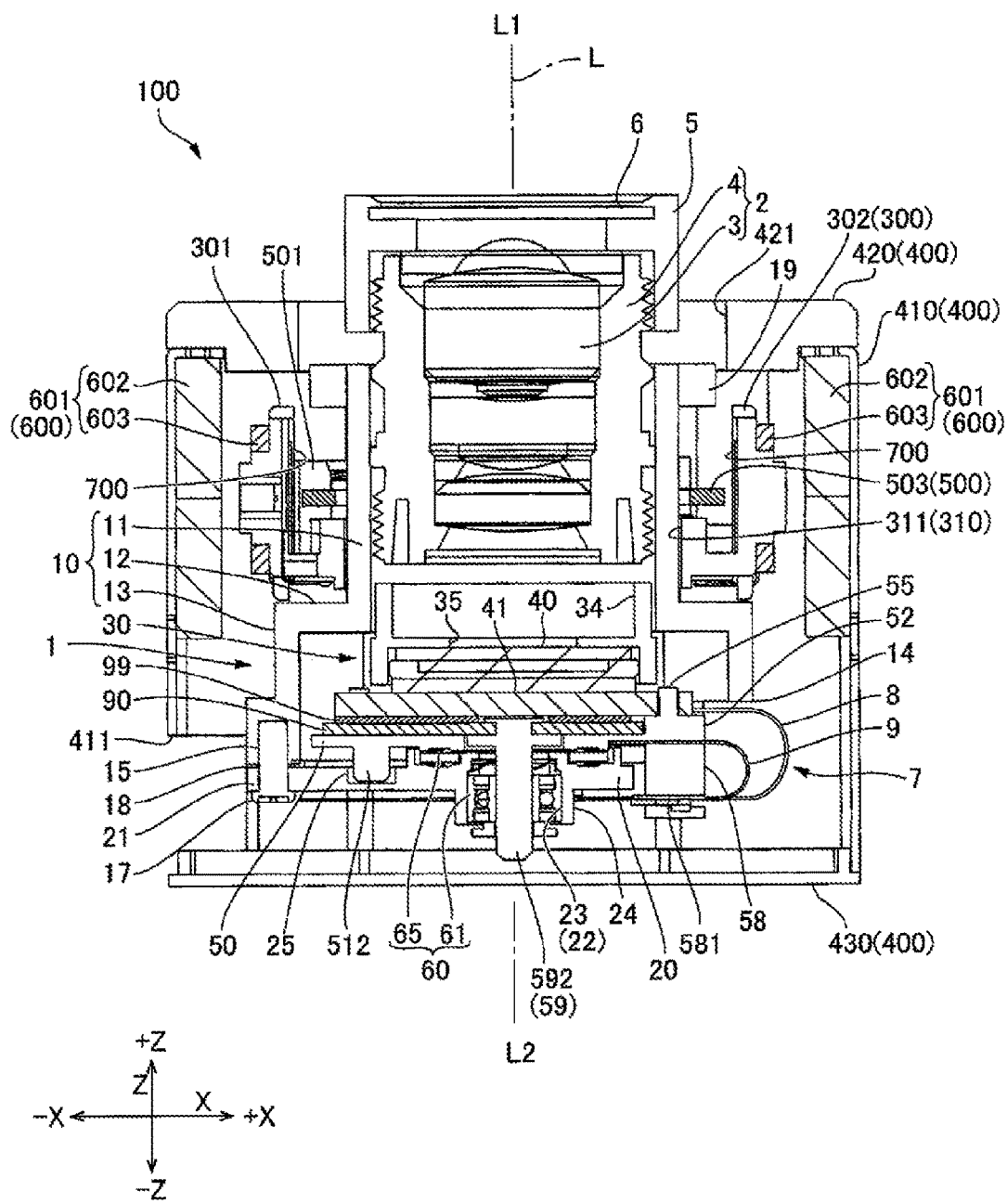
FIG. 4 is a cross-sectional view (i.e., a cross-sectional view taken along a line B-B) of the optical unit with triaxial shake correction function of FIG. 1.

FIG. 1 is an external perspective view of the optical unit 100 with triaxial shake correction function to which at least an embodiment of the present disclosure is applied. FIG. 2 is an exploded perspective view of the optical unit 100 with triaxial shake correction function of FIG. 1. FIGS. 3 and 4 are cross-sectional views of the optical unit 100 with triaxial shake correction function of FIG. 1. Specifically, the cross-sectional view of FIG. 3 is taken along a line A-A of FIG. 1, and the cross-sectional view of FIG. 4 is taken along a line B-B of FIG. 1. In FIGS. 1 and 2, directions of three axes X, Y and Z are orthogonal to each other. Further, one side of the X direction is indicated by +X and the other side is indicated by −X. Further, one side of the Y direction is indicated by +Y and the other side is indicated by −Y. Further, one side of the Z direction is indicated by +Z and the other side is indicated by −Z. The Z direction corresponds to the optical axis L direction of the optical unit 1 with rolling correction function when the optical unit 1 with rolling correction function is in a reference posture. Furthermore, the object side L1 corresponds to the +Z direction, and the counter object side L2 corresponds to the −Z direction.

The optical unit 100 with triaxial shake correction function is configured as follows. The optical unit 1 with rolling correction function that corrects shake on the optical axis L is incorporated in a unit including a shake correction mechanism that corrects shake on an axis orthogonal to the optical axis L. The optical unit 100 with triaxial shake correction function thus performs shake correction in a pitching (i.e., vertical swing) direction and a yawing (i.e., transverse swing) direction. The following description explains a swing supporting mechanism that supports the entire optical unit 1 with rolling correction function such that the optical unit 1 with rolling correction function is able to swing on an axis orthogonal to the optical axis L, and a swing driving mechanism that performs shake correction in the pitching (i.e., vertical swing) direction and the yawing (i.e., transverse swing) direction.

The optical unit 100 with triaxial shake correction function includes: the optical unit 1 with rolling correction function; a holder 300 that holds the optical unit 1 with rolling correction function; a supporting member 400 that is fixed to a main body of an optical device on which the optical unit 100 with triaxial shake correction function is mounted; a gimbal mechanism 500 that supports the optical unit 1 with rolling correction function and the holder 300 such that the optical unit 1 with rolling correction function and the holder 300 are able to swing relative to the supporting member 400; a swing magnetic driving mechanism 600 that causes the optical unit 1 with rolling correction function to swing relative to the supporting member 400; and magnetic members 700 that configure magnetic springs for recovering the optical unit 1 with rolling correction function to the reference posture.

As illustrated in FIG. 2, the optical unit 1 with rolling correction function includes: a lens holder 10 that includes a holder cylinder part 11 in a cylindrical shape; a fixation member 20 that is fixed to a counter object side L2 (−Z direction)-end portion of the lens holder 10; and a lens unit 2 (see FIGS. 3 and 4) that is held on an inner circumferential side of the holder cylinder part 11. A cap 5 provided with a cover glass 6 is attached to an object side L1-tip portion of the lens unit 2. Furthermore, a weight 19 is fixed to an outer circumferential side of the holder cylinder part 11 to adjust the barycentric position of the optical unit 1 with rolling correction function being a movable member.

As illustrated in FIG. 2, the holder 300 includes: a holder main body 310 that is formed with a holding hole 311 in a circular shape in which the holder cylinder part 11 of the optical unit 1 with rolling correction function is held; a pair of wall parts 301 and 302 that are respectively provided on X direction sides of the holder cylinder part 11 held in the holding hole 311; and a pair of wall parts 303 and 304 that are respectively provided on Y direction sides of the holder cylinder part 11. The holder 300 is supported by the gimbal mechanism 500 such that the holder 300 is able to swing on a first axis R1 orthogonal to the optical axis L direction (Z direction) and is able to swing on a second axis R2 orthogonal to the optical axis L direction and the first axis R1. The first axis R1 and the second axis R2 face diagonally at 45 degrees relative to the X direction and the Y direction. The optical unit 1 with rolling correction function is fixed to the holder 300, thereby swinging together with the holder 300.

As illustrated in FIGS. 1 and 2, the supporting member 400 includes: a cylindrical casing 410 whose external shape is substantially octagonal when the cylindrical casing 410 is seen from the optical axis L direction; an object-side casing 420 that is attached to the cylindrical casing 410 from the object side L1; and a counter object-side casing 430 that is attached to the cylindrical casing 410 from the counter object side L2. At a center of the object-side casing 420, there is formed an opening part 421 in a circular shape in which an object side L1-tip portion of the optical unit 1 with rolling correction function is arranged. Furthermore, two second swing supporting parts 502 (to be described later) of the gimbal mechanism 500 are formed on the object-side casing 420 at opposite positions across the opening part 421. A notch 411 is formed in the cylindrical casing 410 by cutting out a −X direction-side surface of the cylindrical casing 410 from the counter object side L2.

The gimbal mechanism 500 is configured between the holder 300 and the supporting member 400. The gimbal mechanism 500 includes: first swing supporting parts 501 that are provided on the holder main body 310 at diagonal positions on the first axis R1; the second swing supporting parts 502 that are provided on the supporting member 400 at diagonal positions on the second axis R2 in the object-side casing 420; and a movable frame 503 that is supported by the first swing supporting parts 501 and the second swing supporting parts 502. The movable frame 503 includes four fulcrum parts provided at positions around the optical axis, and metallic balls (not illustrated) are fixed by way of welding, etc. to outside surfaces of the respective fulcrum parts. The balls respectively make point-contact with contact springs 505 that are held by the first swing supporting parts 501, which are provided on the holder 300, and by the second swing supporting parts 502, which are provided on the supporting member 400. Therefore, the movable frame 503 is supported such that the movable frame 503 is able to rotate on each of the two directions (i.e., the first axis R1 direction and the second axis R2 direction), which are orthogonal to the optical axis L direction.

The swing magnetic driving mechanism 600 includes four pairs of magnetic driving mechanisms 601 that are provided between the holder 300 and the supporting member 400. Each of the magnetic driving mechanisms 601 includes a magnet 602 and a coil 603. The coils 603 are held on outside surfaces of the wall parts 301 to 304 of the holder 300. The magnets 602 are held on X direction-side inside surfaces of the cylindrical casing 410 of the supporting member 400 and on Y direction-side inside surfaces of the cylindrical casing 410 of the supporting member 400. The swing magnetic driving mechanism 600 is arranged on an outer circumferential-side space on the holder cylinder part 11 of the lens holder 10 in the optical unit 1 with rolling correction function.

The magnetic driving mechanism 601 in which the magnet 602 is opposed to the coil 603 is configured between the holder 300 and the supporting member 400 on each of the +X direction side, the −X direction side, the +Y direction side, and the −Y direction side. The two pairs of the magnetic driving mechanisms 601 positioned on the +Y direction side and on the −Y direction side of the holder 300 generate magnetic driving force in the same direction on the X axis when power is supplied to the coils 603. Furthermore, the two pairs of the magnetic driving mechanisms 601 positioned on the +X direction side and on the −X direction side of the holder 300 generate magnetic driving force in the same direction on the Y axis when power is supplied to the coils 603. The swing magnetic driving mechanism 600 causes the optical unit 1 with rolling correction function and the holder 300 to rotate on the first axis R1 and on the second axis R2 by way of synthesizing rotation on the X axis and rotation on the Y axis. In a case of performing shake correction on the X axis and shake correction on the Y axis, the rotation on the first axis R1 and the rotation on the second axis R2 are synthesized.

The magnetic members 700 are fixed to inside surfaces of the wall parts 301 to 304 and are opposed to the magnets 602 across the coils 603 in the radial direction. The magnetic members 700 and the magnets 602 configure magnetic springs that recover the optical unit 1 with rolling correction function being a movable member and the holder 300 to the reference posture.

(Optical Unit with Rolling Correction Function)

Figure 5A:
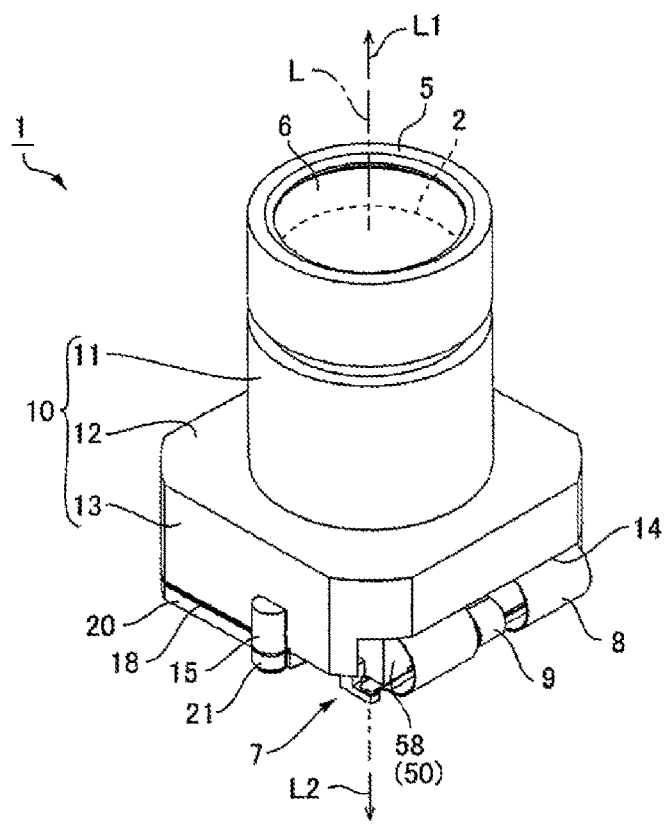
FIG. 5A is a perspective view of an optical unit with rolling correction function, in which the optical unit with rolling correction function is seen from an object side.
Figure 5B:
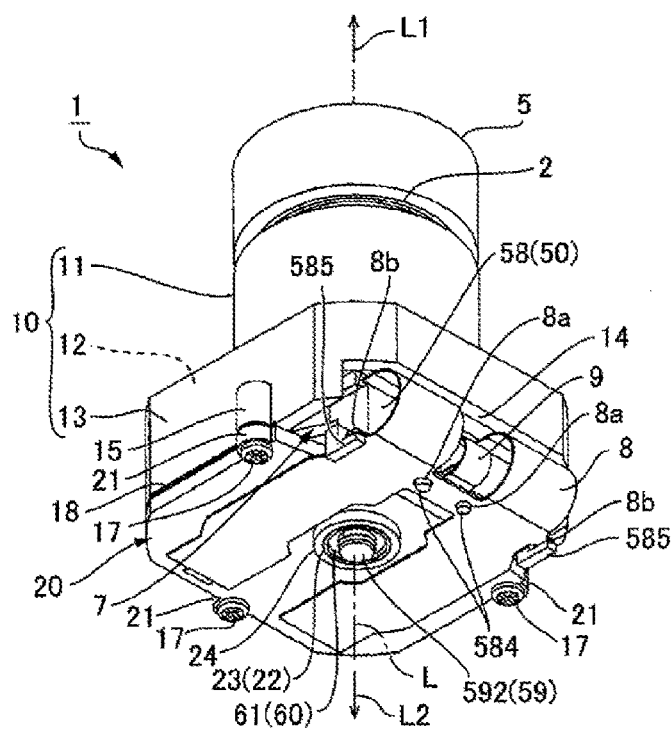
FIG. 5B is a perspective view of the optical unit with rolling correction function, in which the optical unit with rolling correction function is seen from a counter object side.

FIG. 5A is a perspective view of the optical unit 1 with rolling correction function, in which the optical unit 1 with rolling correction function is seen from the object side L1, and FIG. 5B is a perspective view of the optical unit 1 with rolling correction function, in which the optical unit 1 with rolling correction function is seen from the counter object side L2. As illustrated in FIGS. 3 and 4, the optical unit 1 with rolling correction function includes: the lens unit 2 in which a lens 3 being an optical element is attached to a mirror cylinder 4; the lens holder 10 that holds the lens unit 2; the cap 5 that is attached to an object side L1-end portion of the lens unit 2; and the fixation member 20 that is fixed to a counter object side L2-end portion of the lens holder 10. The lens holder 10 is secured to the fixation member 20 with screw members 17, with an elastic member 18 sandwiched between the lens holder 10 and the fixation member 20.

(Lens Holder and Fixation Member)

As illustrated in FIGS. 2 to 5B, the lens holder 10 includes: the holder cylinder part 11 in a cylinder shape; a stepped part 12 that expands radially outward from a counter object side L2-end portion of the holder cylinder part 11; and a side plate part 13 that extends in a cylindrical shape from an outer circumferential edge of the stepped part 12 toward the counter object side L2. As illustrated in FIGS. 3 and 4, the mirror cylinder 4 of the lens unit 2 is held on the inner circumferential side of the holder cylinder part 11. In this state, the optical axis L of the lens unit 2 corresponds to the center axis of the holder cylinder part 11 of the lens holder 10. The stepped part 12 has such a shape that the four corners of a square are cut out, when the stepped part 12 is seen from the optical axis L direction. The side plate part 13 is formed with a cutout part 14 obtained by cutting out a counter object side L2-edge of a chamfered surface provided on one side surface of the side plate part 13 and corners on both sides of the side surface by a predetermined height. The side plate part 13 is also formed with boss parts 15 respectively provided on three side surfaces other than the side surface in which the cutout part 14 is formed.

The fixation member 20 is in a plate shape as a whole and is arranged perpendicular to the optical axis L direction. The fixation member 20 has a shape obtained by linearly cutting out a one side—(i.e., cutout part 14 side—) edge of the shape in which the side plate part 13 is seen from the optical axis L direction. Accordingly, when the fixation member 20 is fixed to a counter object side L2-end portion of the side plate part 13, an opening part 7 is formed between the cutout part 14 and the fixation member 20 such that the opening part 7 is opened on the counter object side L2 of the optical axis L direction in a direction orthogonal to the optical axis L direction. Flexible printed circuit boards 8 and 9 (to be described later) are taken out of the optical unit 1 with rolling correction function through the opening part 7.

The elastic member 18 is sandwiched between an outer circumferential edge of the fixation member 20 and the side plate part 13 of the lens holder 10 except for a range where the cutout part 14 is formed. Therefore, a clearance between the lens holder 10 and the fixation member 20 is sealed with the elastic member 18 except for a range where the opening part 7 is formed. The fixation member 20 is formed with three protrusion parts 21 protruding radially outward at positions opposed to the boss parts 15 of the side plate part 13 in the optical axis L direction. The screw members 17 for fixing the fixation member 20 to the lens holder 10 are inserted into screw holes Ruined in the protrusion parts 21 and are secured to the boss parts 15. The fixation positions with the screw members 17 are located radially outside the position where the elastic member 18 is sandwiched. The tilt of the optical axis L of the lens unit 2 held by the lens holder 10 is adjusted by adjusting the secured states of the three screw members 17. It is accordingly possible to perform tilt angle adjustment for the lens unit 2 relative to the imaging element 40.

(Internal Structure of Optical Unit with Rolling Correction Function)

As illustrated in FIGS. 3 and 4, the lens unit 2 is provided, on the counter object side L2, with: a circuit board 41 on which the imaging element 40 is mounted; a cover member 30 with which the imaging element 40 is covered from the object side L1; a heat dissipating member 90 that is in a plate shape and is arranged on the counter object side L2 of the circuit board 41; a rotation seat 50 to which the heat dissipating member 90 and the circuit board 41 are fixed; a rotation supporting mechanism 60 that supports the rotation seat 50 such that the rotation seat 50 is able to rotate on the optical axis L; and a rolling magnetic driving mechanism 70 that causes the rotation seat 50 to rotate on the optical axis L.

(Cover Member)

Figure 6:
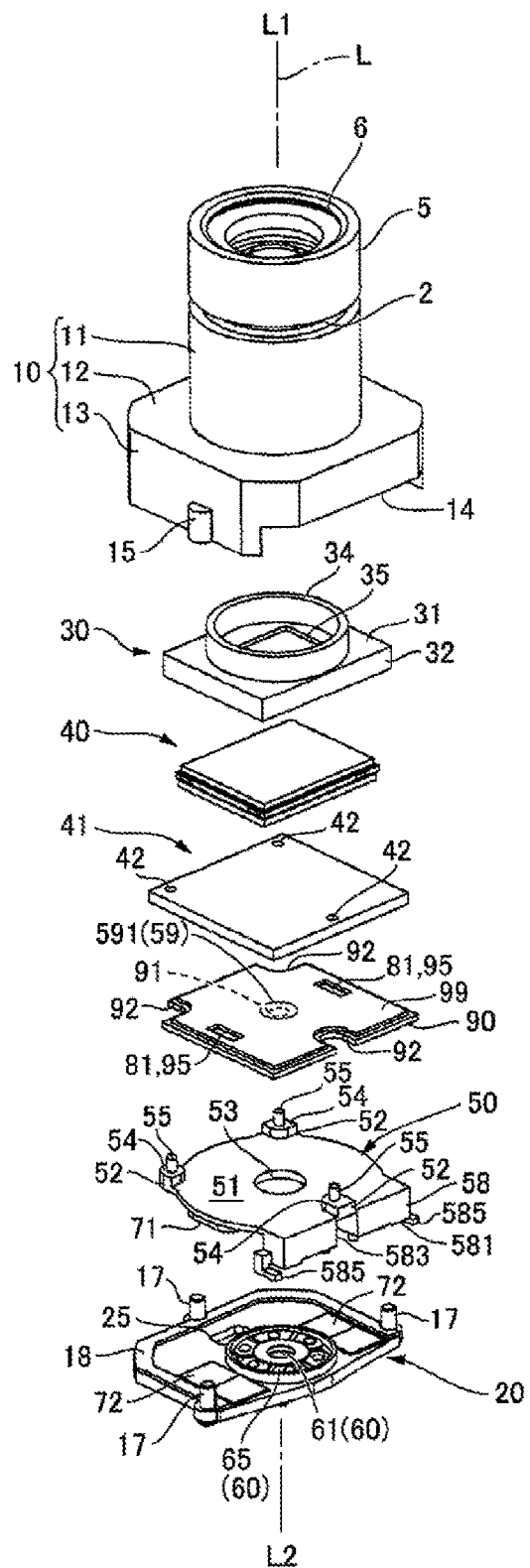
FIG. 6 is an exploded perspective view of the optical unit with rolling correction function, in which the optical unit with rolling correction function is seen from the object side.
Figure 7:
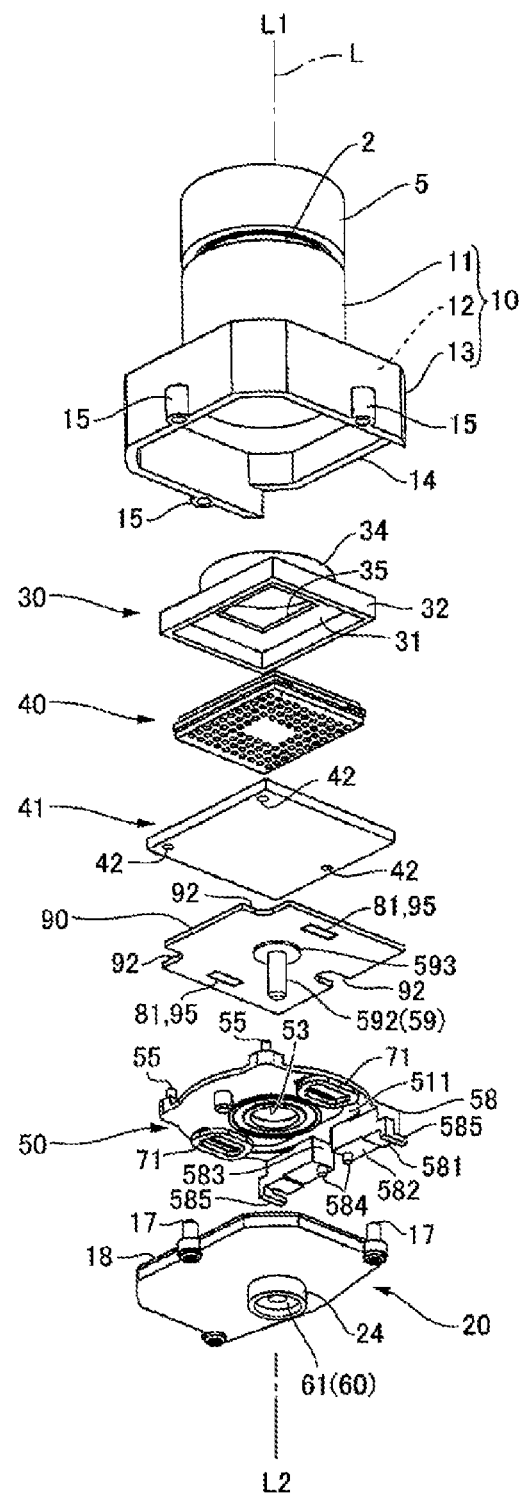
FIG. 7 is an exploded perspective view of the optical unit with rolling correction function, in which the optical unit with rolling correction function is seen from the counter object side.

FIGS. 6 and 7 are exploded perspective views of the optical unit 1 with rolling correction function. Specifically, the exploded perspective view of FIG. 6 illustrates the optical unit 1 with rolling correction function which is seen from the object side, and the exploded perspective view of FIG. 7 illustrates the optical unit 1 with rolling correction function which is seen from the counter object side. As illustrated in FIGS. 6 and 7, the cover member 30 includes: an end plate part 31 that is in a substantially rectangular shape and covers the imaging element 40 from the object side L1; a side plate part 32 that protrudes from an outer circumferential edge of the end plate part 31 toward the counter object side L2; and a cylinder part 34 that is in cylindrical shape, is located radially inside the outer circumferential edge of the end plate part 31, and extends toward the object side L1. An aperture 35 is formed on an inner circumferential side of the cylinder part 34 and at a center of the end plate part 31 to define a light incoming region to the imaging element 40. Light from the lens unit 2 is incident on the imaging element 40 through the aperture 35. The position and shape of the aperture 35 are determined in accordance with the imaging element 40. In this embodiment, the aperture 35 is in a rectangular shape since the imaging element 40 is in a rectangular shape when the imaging element 40 is seen from the optical axis L direction.

As illustrated in FIGS. 3 and 4, the end plate part 31 of the cover member 30 is abutted against an outer circumferential edge of the circuit board 41 from the object side L1. Therefore, the imaging element 40 except the aperture 35 is covered from the outside. The cylinder part 34 enclosing the aperture 35 and extending toward the object side L1 has an outer circumferential surface that is opposed in the radial direction to an inner circumferential surface of the holder cylinder part 11 with a predetermined clearance. Furthermore, the end plate part 31 of the cover member 30 is opposed in the optical axis L direction to the stepped part 12 of the lens holder 10 with a predetermined clearance on an outer circumferential side of the cylinder part 34. In other words, a bent and narrow clearance is formed between the lens holder 10 and the cover member 30 to form a labyrinth structure.

(Structure for Fixation of Circuit Board, Heat Dissipating Member, and Rotation Shaft to Rotation Seat)

As illustrated in FIG. 6, the rotation seat 50 includes: a heat dissipating member fixation surface 51 that is directed to the object side L1; and three circuit board fixation parts 52 that protrude from an outer circumferential edge of the heat dissipating member fixation surface 51 toward the object side L1. Furthermore, the rotation seat 50 is formed with a circular hole 53 that passes through a center of the heat dissipating member fixation surface 51. The heat dissipating member fixation surface 51 is a surface perpendicular to the optical axis L. The heat dissipating member 90 and the circuit board 41 are fixed to the rotation seat 50. In this embodiment, the heat dissipating member 90 is fixed to the heat dissipating member fixation surface 51, and the circuit board 41 is fixed to the three circuit board fixation parts 52. When the circuit board 41 is fixed to the circuit board fixation parts 52, the circuit board 41 comes into contact with a heat conductive sheet 99 affixed to the heat dissipating member 90 (see FIGS. 3, 4, 8A, 8B, and 8C).

Figure 8A:
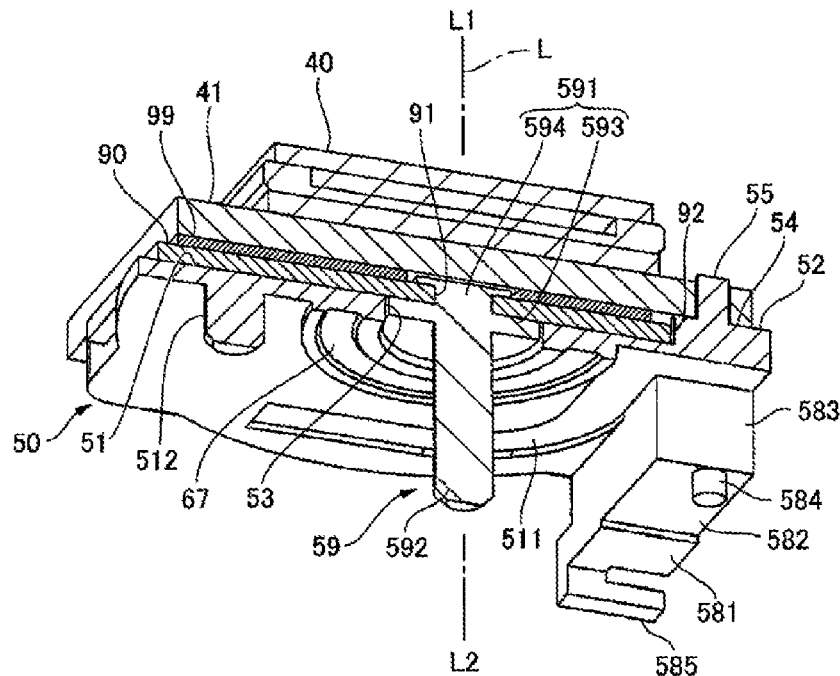
FIG. 8A is a perspective, cross-sectional view of an imaging element, a circuit board, a heat dissipating member, a rotation seat, and a rotation shaft.

FIG. 8A is a perspective, cross-sectional view of the imaging element 40, the circuit board 41, the heat dissipating member 90, the rotation seat 50, and a rotation shaft 59. In this embodiment, the rotation shaft 59 of the rotation supporting mechanism 60 is fixed to the heat dissipating member 90, and the rotation shaft 59 is fixed to the rotation seat 50 with the heat dissipating member 90 interposed between the rotation shaft 59 and the rotation seat 50. As illustrated in FIG. 8A, the rotation shaft 59 includes: a fixation part 591 that is fixed to the heat dissipating member 90; and a shaft part 592 that protrudes from the fixation part 591 toward the counter object side L2. The fixation part 591 includes: a flange part 593 that is larger in diameter than the shaft part 592; and a projection part 594 that protrudes from a center of the flange part 593 toward the object side L1. A rotation shaft fixation hole 91 being a circular through hole is formed in a center of the heat dissipating member 90. The projection part 594 of the rotation shaft 59 is inserted into the rotation shaft fixation hole 91, and the flange part 593 is abutted against the heat dissipating member 90 from the counter object side L2, on an outer circumferential side of the rotation shaft fixation hole 91. In other words, the flange part 593 functions as an abutting part that is abutted against the heat dissipating member 90 from the counter object side L2 to ensure a contact area with the heat dissipating member 90. Furthermore, the projection part 594 is fixed to the rotation shaft fixation hole 91. In this embodiment, the rotation shaft 59 is fixed to the heat dissipating member 90 by crimping the projection part 594 protruding from the rotation shaft fixation hole 91 toward the object side L1. Note that the projection part 594 may be fixed by press-fitting rather than crimping. Furthermore, the flange part 593 may be fixed to the heat dissipating member 90. Alternatively, in a case where each of the rotation shaft 59 and the heat dissipating member 90 is made of metal, the rotation shaft 59 may be fixed by laser welding. In a case where the rotation shaft 59 is fixed by a method except crimping, the rotation shaft fixation hole 91 may be a depression part rather than a through hole.

The circular hole 53 in the rotation seat 50 is larger in diameter than the flange part 593. Therefore, in fixing the heat dissipating member 90 to the rotation seat 50, the flange part 593 is arranged in the circular hole 53, and the heat dissipating member 90 is abutted against and fixed to the heat dissipating member fixation surface 51 of the rotation seat 50. The shaft part 592 of the rotation shaft 59 protrudes from the circular hole 53 in the rotation seat 50 toward the counter object side L2. As illustrated in FIGS. 3 and 4, on the counter object side L2 of the rotation seat 50, the shaft part 592 of the rotation shaft 59 is held by a bearing part 61 provided on the fixation member 20, such that the shaft part 592 is able to rotate. A tip portion of the rotation shaft 59 protrudes from the bearing part 61 toward the counter object side L2. It is accordingly possible to efficiently dissipate heat from the rotation shaft 59 since the tip portion of the rotation shaft 59 is exposed on the counter object side L2 of the fixation member 20. It is also possible to dissipate the heat by transferring the heat to the fixation member 20 via the bearing part 61.

Figure 8B:
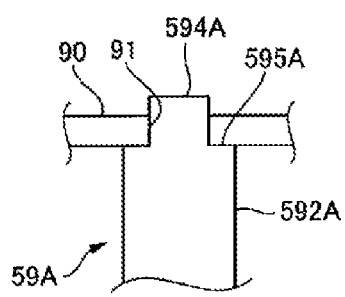
FIG. 8B is an explanatory diagram illustrating a variation example of a structure for fixing the rotation shaft.
Figure 8C:
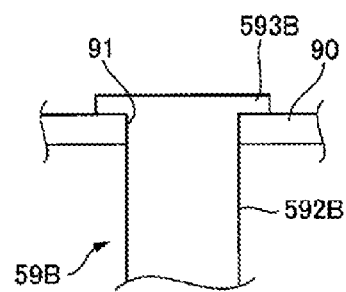
FIG. 8C is an explanatory diagram illustrating a variation example of the structure for fixing the rotation shaft.

FIGS. 8B and 8C are explanatory diagrams illustrating variation examples of the structure for fixing the rotation shaft 59. A rotation shaft 59A illustrated in FIG. 8B includes a shaft part 592A; and a projection part 594A that is smaller in diameter than the shaft part 592A. A stepped part 595A directed to the object side L1 is formed on an outer circumferential side of the projection part 594A. In this example, the stepped part 595A serves as an abutting part that is abutted against the heat dissipating member 90 from the counter object side L2, and the rotation shaft 59A can be fixed to the heat dissipating member 90 by a method such as crimping, press-fitting, or laser welding. A rotation shaft 59B illustrated in FIG. 8C includes a flange part 593B that is formed on an object side L1-end portion of the rotation shaft 59B. The flange part 593B serves as an abutting part that is abutted against the heat dissipating member 90 from the object side L1. A shaft part 592B protrudes toward the counter object side L2 through the rotation shaft fixation hole 91. In the example of FIG. 8C, the flange part 593B can be fixed by laser welding to the heat dissipating member 90 or the shaft part 592B can be fixed by press-fitting to the rotation shaft fixation hole 91.

As illustrated in FIGS. 6 and 7, the rotation seat 50 is formed with a protrusion part 58 that is in a rectangular shape and projects from an outer circumferential side of the rotation seat 50 at an angular position where the cutout part 14 of the lens holder 10 is provided. The heat dissipating member fixation surface 51 has an external shape that is in a substantially circular shape except for an angular position where the protrusion part 58 is formed. One of the three circuit board fixation parts 52 formed on the outer circumferential edge of the heat dissipating member fixation surface 51 is formed at a center of the protrusion part 58. The remaining two circuit board fixation parts 52 are formed opposite the protrusion part 58 across the circular hole 53, and are arranged symmetrically with respect to the circuit board fixation part 52 formed at the center of the protrusion part 58. Each of the three circuit board fixation parts 52 includes: a circuit board fixation surface 54 that is formed at a midway position in the optical axis L direction, and a circuit board fixation projection part 55 that protrudes from the circuit board fixation surface 54 toward the object side L1.

The heat dissipating member 90 has an external shape that is in a substantially rectangular shape, and is formed with three notches 92 at positions overlapping with the circuit board fixation parts 52. Accordingly, the circuit board fixation parts 52 are fitted to the three notches 92, and the rotation shaft 59 fixed at the center of the heat dissipating member 90 is arranged in the circular hole 53, so that the heat dissipating member 90 is attached to be abutted against the heat dissipating member fixation surface 51 from the object side L1. On the other hand, the circuit board 41, on which the imaging element 40 is mounted, is formed with three fixation holes 42 at positions overlapping with the circuit board fixation projection parts 55. When the circuit board fixation projection parts 55 are fitted to the fixation holes 42 in the circuit board 41, and an end portion of the circuit board 41 is abutted against the circuit board fixation surfaces 54, the circuit board 41 comes into contact with a surface of the heat conductive sheet 99 affixed to an object side L1-surface of the heat dissipating member 90.

The heat dissipating member 90 is a plate member that is made of nonmagnetic metal such as aluminum or copper. Heat generated from the imaging element 40 is transmitted from the circuit board 41 to the heat dissipating member 90 via the heat conductive sheet 99. The heat conductive sheet 99 may be configured to form a heat conductive layer between the circuit board 41 and the heat dissipating member 90. For example, the heat conductive sheet 99 may be a rubber sheet with good heat conductivity. Alternatively, a heat conductive layer may be formed by applying a gel paste with good conductivity or a heat conductive adhesive to a surface of the heat dissipating member 90. The rotation seat 50 is a filler-containing resin member, which exhibits good heat conductivity. For example, the rotation seat 50 may be a resin member containing glass fiber reinforcing material and high-heat conductive filler. The use of the filler-containing resin member enables efficient heat transmission from the heat dissipating member 90 to the rotation seat 50. In this embodiment, the rotation shaft 59 may also be a filler-containing resin member. Since the rotation shaft 59 is fixed to the heat dissipating member 90, heat from the heat dissipating member 90 is efficiently transmitted to the rotation shaft 59. Note that only one of the rotation shaft 59 and the rotation seat 50 may be a filler-containing resin member, and the rotation shaft 59 may be made of metal.

Figure 9:
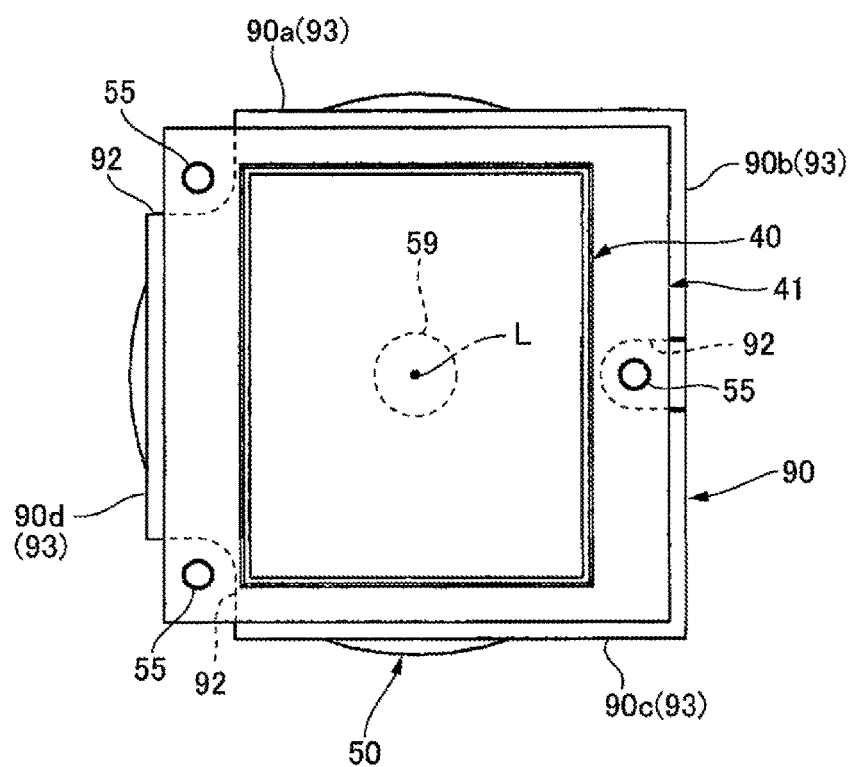
FIG. 9 is a plan view of the imaging element, the circuit board, the heat dissipating member, the rotation seat, and the rotation shaft, in which the imaging element, the circuit board, the heat dissipating member, the rotation seat, and the rotation shaft are seen from the object side.

FIG. 9 is a plan view of the imaging element 40, the circuit board 41, the heat dissipating member 90, the rotation seat 50, and the rotation shaft 59, in which the imaging element 40, the circuit board 41, the heat dissipating member 90, the rotation seat 50, and the rotation shaft 59 are seen from the object side L1. In this embodiment, each of the heat dissipating member 90 and the circuit board 41 is in a rectangular shape, and the heat dissipating member 90 is larger in dimensions than the circuit board 41. As illustrated in FIG. 9, an outer circumferential edge of the heat dissipating member 90 includes a first side 90a, a second side 90b, a third side 90c, and a fourth side 90d extending along the four sides of the outer circumferential edge of the circuit board 41. The first side 90a, the second side 90b, the third side 90c, and the fourth side 90d are located outside the outer circumferential edge of the circuit board 41 except for the positions where the three notches 92 overlapping with the circuit board fixation parts 52 are formed. In other words, all the sides, that is, the first side 90a, the second side 90b, the third side 90c, and the fourth side 90d, of the heat dissipating member 90 project outside the outer circumferential edge of the circuit board 41.

As illustrated in FIGS. 3, 4, 8A, 8B, 8C and 9, the outer circumferential edge of the heat dissipating member 90 is exposed from the circuit board 41 and the rotation seat 50, except for the positions where the three notches 92 are formed. In other words, the heat dissipating member 90 is provided with exposed parts 93 that are exposed from the circuit board 41 and the rotation seat 50, on all the sides, that is, the first side 90a, the second side 90b, the third side 90c, and the fourth side 90d. The exposed parts 93 are out of contact with not only the circuit board 41 and the rotation seat 50, but also the other members. It is accordingly possible to dissipate heat from the exposed parts 93 at all the sides of the heat dissipating member 90, and it is therefore possible to evenly dissipate heat in a circumferential direction. It is hence possible to efficiently dissipate heat, which is generated from the imaging element 40, from the heat dissipating member 90.

Note that each of the circuit board 41 and the heat dissipating member 90 in this embodiment is in a rectangular shape, but may be in a polygonal shape rather than the rectangular shape. It is preferable that the heat dissipating member 90 is larger in dimensions than the circuit board 41, the sides of the heat dissipating member 90 respectively extending along the sides of the circuit board 41 respectively project outside the outer circumferential sides of the circuit board 41, and the exposed parts are provided on all the sides.

As illustrated in FIGS. 8A to 8C and 9, the imaging element 40 mounted on the circuit board 41 overlaps with the heat dissipating member 90 and the rotation shaft 59 at an identical position when the imaging element 40 is seen from the optical axis L direction. Furthermore, the heat dissipating member 90 is larger than the imaging element 40. The entire imaging element 40 therefore overlaps with the heat dissipating member 90 and the rotation shaft 59 when the imaging element 40 is seen from the optical axis L direction. It is accordingly possible to efficiently transmit heat since a route for heat transmission from the imaging element 40 to the rotation shaft 59 via the circuit board 41 and heat dissipating member 90 is short. It is therefore possible to efficiently dissipate heat, which is generated from the imaging element 40, from the rotation shaft 59.

As illustrated in FIGS. 6 and 7, the heat dissipating member 90 is formed with two magnetic member arrangement holes 95 to which magnetic members 81 are mounted. The magnetic member arrangement holes 95 are located radially outside the rotation shaft 59 at symmetrical positions with respect to the optical axis L. The two magnetic member arrangement holes 95 are formed at the symmetrical positions with respect to the optical axis L. The magnetic members 81 configure magnetic springs (posture recovering mechanism 80) that recover the rotation seat 50 to a reference position of rotation, as will be described later.

(Rotation Supporting Mechanism)

As illustrated in FIGS. 3, 4, and 7, a bearing holding part 22 is formed at a radial center of the fixation member 20. The bearing holding part 22 has a holding hole 23 that penetrates the fixation member 20 in the optical axis L direction. An annular protrusion part 24 is formed on a counter object side L2-surface of the fixation member 20 such that the annular protrusion part 24 encloses the holding hole 23 and extends toward the counter object side L2. The rotation supporting mechanism 60 includes: the rotation shaft 59 that is fixed to the rotation seat 50; the bearing part 61 that is held by the bearing holding part 22; and a rotation supporting part 65 that is configured between the fixation member 20 and the rotation seat 50 radially outside the bearing part 61. In other words, the rotation supporting mechanism 60 is configured with two pairs of rotation supporting parts including: the rotation shaft 59 and bearing part 61; and the rotation supporting part 65.

Figure 10A:
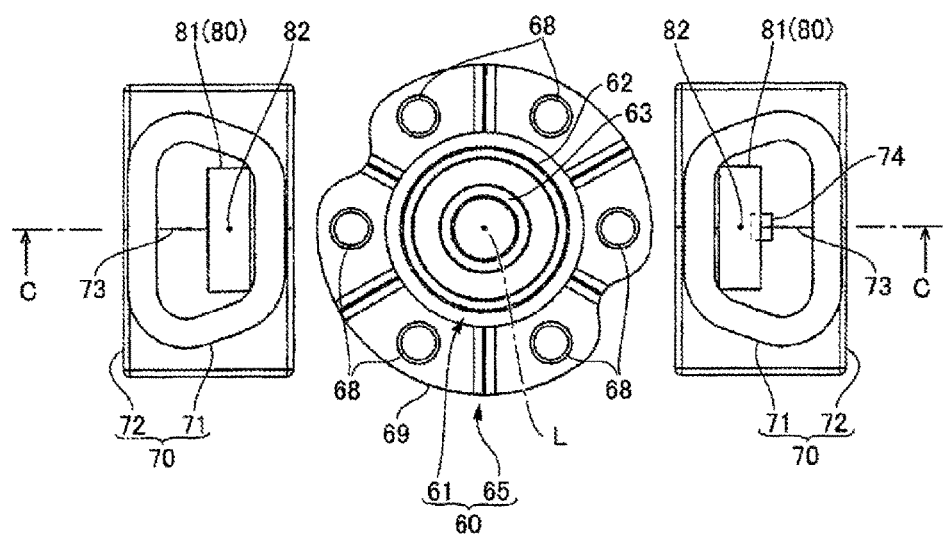
FIG. 10A is a plan view of a rolling magnetic driving mechanism and a rotation supporting mechanism.
Figure 10B:
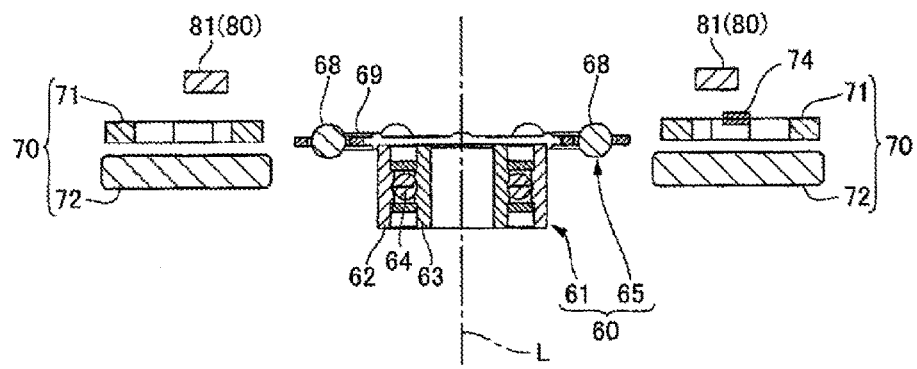
FIG. 10B is a cross-sectional view of the rolling magnetic driving mechanism and the rotation supporting mechanism.

FIG. 10A is a plan view of the rolling magnetic driving mechanism 70 and the rotation supporting mechanism 60. FIG. 10B is a cross-sectional view taken along a line C-C of FIG. 10A. As illustrated in FIG. 10B, the bearing part 61 includes: an outer ring 62 that is fixed to an inner circumferential surface of the holding hole 23 in the fixation member 20; an inner ring 63 that is fixed to an outer circumferential surface of the rotation shaft 59; and balls 64 that are arranged between the outer ring 62 and the inner ring 63. As illustrated in FIGS. 3, 4, and 5B, the tip portion of the rotation shaft 59 protrudes from the inner ring 63 of the bearing part 61 toward the counter object side L2. The tip portion of the rotation shaft 59 protrudes toward the counter object side L2 relative to the annular protrusion part 24 formed on the fixation member 20. As illustrated in FIGS. 3 and 4, the rotation supporting part 65 includes: a fixation member-side annular groove 66 that is formed in an object side L1-surface of the fixation member 20; a rotation member-side annular groove 67 (see FIGS. 8A to 8C) that is formed in a counter object side L2-surface of the rotation seat 50; a roll moving member 68 that is arranged between the fixation member-side annular groove 66 and the rotation member-side annular groove 67; and a retainer 69 that holds the roll moving member 68 between the fixation member-side annular groove 66 and the rotation member-side annular groove 67.

As illustrated in FIGS. 3 and 4, the fixation member-side annular groove 66 is formed radially outside an outer circumferential surface of the outer ring 62 of the bearing part 61. Therefore, a bottom surface of the fixation member-side annular groove 66 is at a position depressed toward the counter object side L2 relative to an object side L1-end surface of the outer ring 62 of the bearing part 61. Furthermore, the rotation supporting part 65 has a structure in that the fixation member-side annular groove 66 is opposed to the rotation member-side annular groove 67 in the optical axis L direction. Therefore, the thickness of the rotation supporting part 65 in the optical axis L direction is smaller than the thickness of the bearing part 61 in the optical axis L direction. Accordingly, the rotation supporting mechanism 60 is structured to have a lower height in the optical axis L direction as compared with the configuration in which two pairs of ball bearings like the bearing part 61 are stacked and arranged in the optical axis L direction.

(Rolling Magnetic Driving Mechanism)

The plan view of FIG. 10A illustrates the rolling magnetic driving mechanism 70 in a case where the rotation seat 50 is at the reference position of rotation. As illustrated in FIG. 3, when the rotation shaft 59 fixed to the rotation seat 50 via the heat dissipating member 90 is held to be able to rotate via the bearing part 61 attached to the bearing holding part 22, the rolling magnetic driving mechanism 70 is configured between the rotation seat 50 and the fixation member 20. The rolling magnetic driving mechanism 70 includes: a pair of coils 71 that are arranged on both sides in the radial direction across the rotation shaft 59 fixed to the rotation seat 50; and a pair of magnets 72 that are arranged on both sides in the radial direction across the bearing holding part 22 of the fixation member 20. The coils 71 are opposed to the magnets 72 with a predetermined gap in the optical axis L direction.

As illustrated in FIG. 10A, each of the magnets 72 is separated into two with respect to the circumferential direction and is magnetized such that the magnetic poles on surfaces opposed to the coils 71 are different with reference to a magnetization polarized line 73 extending in the radial direction. The coils 71 are coreless coils, and long edge portions extending in the radial direction are utilized as effective edges. A Hall element 74 is arranged inside one of the coils 71. The Hall element 74 is fixed to the flexible printed circuit board 9 that supplies power to the coils 71. The Hall element 74 is opposed to the magnetization polarized line 73 of the magnets 72 when the rotation seat 50 is at a predetermined reference position of rotation. The rolling magnetic driving mechanism 70 is controlled based on an origin position in a rolling direction detected based on a signal from the Hall element 74. The rolling magnetic driving mechanism 70 thus performs rolling correction by rotating a rotation member including the cover member 30, the imaging element 40, the circuit board 41, and the heat dissipating member 90 each fixed to the rotation seat 50, on the optical axis L. In other words, the optical unit 1 with rolling correction function performs the rolling correction by rotating the small rotation member not including the lens unit 2 and the lens holder 10.

As illustrated in FIGS. 4 and 7, the rotation seat 50 is formed with a rotation restraining projection part 512 that protrudes toward the fixation member 20. As illustrated in FIGS. 4 and 6, the fixation member 20 is formed with a rotation restraining depression part 25 into which a tip portion of the rotation restraining projection part 512 is inserted. As illustrated in FIG. 6, the rotation restraining depression part 25 extends over a predetermined angle range in the circumferential direction. The rotation restraining projection part 512 and the rotation restraining depression part 25 configure a rotation retraining part that restrains the rotation range of the rotation seat 50 (i.e., the rotation range for rolling correction) relative to the fixation member 20.

(Posture Recovering Mechanism)

The optical unit 1 with rolling correction function includes the posture recovering mechanism 80 the recovers the rotation seat 50 to the predetermined reference position of rotation. The posture recovering mechanism 80 includes two pairs of magnetic springs configured with the two magnetic members 81 fixed to the rotation seat 50, and the two magnets 72 configuring the rolling magnetic driving mechanism 70. As described above, the magnetic members 81 are respectively arranged in the magnetic member arrangement holes 95 in the heat dissipating member 90. The magnetic members 81 are opposed to the magnets 72 across the coils 71 in the optical axis L direction. As illustrated in FIG. 10A, the magnetic members 81 are in a rectangular shape of which the circumferential dimensions are longer than the radial dimensions. On condition that the rotation seat 50 is at the reference position of rotation, circumferential centers 82 of the magnetic members 81 are at positions overlapping with the magnetization polarized line 73 of the magnets 72 when the magnetic members 81 are seen from the optical axis L direction.

When the rotation seat 50 rotates from the reference position of rotation, the centers 82 of the magnetic members 81 move away from the magnetization polarized line 73 of the magnets 72 in the circumferential direction. Therefore, magnetic attractive force in such a direction that the centers 82 of the magnetic members 81 correspond to the angular position of the magnetization polarized line 73 of the magnets 72 is exerted between the magnetic members 81 and the magnets 72. In other words, when the rotation seat 50 moves away from the reference position of rotation, magnetic attractive force in such a direction as to recover the rotation seat 50 to the reference position of rotation is exerted on the posture recovering mechanism 80. This embodiment employs the two pairs of the magnetic springs each including the magnetic member 81 and the magnet 72, but may employ one pair of the magnetic springs. In other words, the number of magnetic members 81 may be one. Furthermore, the rolling magnetic driving mechanism 70 may include at least one pair of the coil 71 and the magnet 72.

(Structure for Fixation of Flexible Printed Circuit Board)

As illustrated in FIG. 4, the flexible printed circuit board 8 for the imaging element 40 is connected to the circuit board 41 on which the imaging element 40 is mounted. An edge of the circuit board 41, to which the flexible printed circuit board 8 is connected, is opposed to the opening part 7 formed between the cutout part 14 of the lens holder 10 and the fixation member 20. The flexible printed circuit board 8 is drawn radially outward from the circuit board 41 through the opening part 7, is folded back in a U shape, and then is drawn toward the counter object side L2 of the fixation member 20.

As illustrated in FIGS. 4 and 5B, the flexible printed circuit board 9 for the rolling magnetic driving mechanism 70 is arranged in a fixation groove 511 (see FIGS. 7 to 8C) formed in the counter object side L2-surface of the rotation seat 50, and is drawn to the positions of the coils 71. The flexible printed circuit board 9 is drawn radially outward from the angular position between one of the coils 71 and the other coil 71. The opening part 7 is provided at the angular position. Accordingly, the flexible printed circuit board 9 for the rolling magnetic driving mechanism 70 and the flexible printed circuit board 8 for the imaging element 40 are drawn radially outward through the opening part 7, are folded back in the U shape, and then are drawn toward the counter object side L2 of the fixation member 20.

As illustrated in FIG. 4, in each of the flexible printed circuit board 9 for the rolling magnetic driving mechanism 70 and the flexible printed circuit board 8 for the imaging element 40, at the outside of the opening part 7, a portion immediately after being folded back in the U shape is fixed to a fixation surface 581 that is provided on the protrusion part 58 protruding from the rotation seat 50. In other words, the flexible printed circuit boards 8 and 9 overlapping each other are collectively fixed to the fixation surface 581. As illustrated in FIG. 7, the protrusion part 58 is in a substantially rectangular parallelepiped shape, and a counter object side L2-end surface of the protrusion part 58 serves as the fixation surface 581.

As illustrated in FIG. 7, the fixation surface 581 is a horizontally oriented rectangular surface having a longer width in a direction orthogonal to the direction in which the flexible printed circuit boards 8 and 9 are drawn (i.e., the radial direction). A wide groove 582 with a depth corresponding to the thickness of the flexible printed circuit board 9 is formed at a widthwise center of the fixation surface 581. A depression part 583 is formed at a widthwise center of the groove 582 to allow passage of a portion of the flexible printed circuit board 9 to be drawn radially outward from the rotation seat 50.

The fixation surface 581 is formed with a projection part 584 and a hook part 585 each serving as a fixation part for fixing the flexible printed circuit board 8. The flexible printed circuit board 8 is formed with an engagement hole 8a and a hooked part 8b. In fixing the flexible printed circuit board 8 to the fixation surface 581, the flexible printed circuit board 8 is superimposed on the flexible printed circuit board 9, the flexible printed circuit board 8 is allowed to slide along the fixation surface 581, and the hooked part 8b is engaged with the hook part 585. Furthermore, the projection part 584 is fitted to the engagement hole 8a (see FIG. 5B). The flexible printed circuit board 8 for the imaging element 40 is thus fixed to the fixation surface 581. Furthermore, the flexible printed circuit board 9 for the rolling magnetic driving mechanism 70 is pressed by the flexible printed circuit board 8 and is therefore fixed to the fixation surface 581.

(Main Functional Effects of this Embodiment)

In the optical unit 1 with rolling correction function according to this embodiment, the circuit board 41 on which the imaging element 40 is mounted and the heat dissipating member 90 to which the heat from the circuit board 41 is transmitted are fixed to the rotation seat 50 supported by the rotation supporting mechanism 60 such that the rotation seat 50 is able to rotate, in order to perform the rolling correction. Furthermore, the rotation shaft 59 is fixed to the rotation seat 50 via the heat dissipating member 90. It is accordingly possible to dissipate heat by transmitting heat that is generated from the imaging element 40, from the circuit board 41 to the heat dissipating member 90, and then transmitting the heat from the heat dissipating member 90 to the rotation shaft 59. Furthermore, the imaging element 40 and the heat dissipating member 90 overlap with the rotation shaft 59 at the identical position when the imaging element 40 and the heat dissipating member 90 are seen from the optical axis L direction. It is accordingly possible to transmit heat that is generated from the imaging element 40, to the rotation shaft 59 in the short route via the circuit board 41 and the heat dissipating member 90, and it is therefore possible to efficiently dissipate the heat generated from the imaging element 40. Furthermore, the circuit board 41 is in contact with the heat dissipating member 90 via the heat conductive layer (i.e., the heat conductive sheet 99). It is therefore possible to efficiently dissipate heat from the circuit board 41 to the heat dissipating member 90 by means of the heat conductive layer. It is accordingly possible to efficiently dissipate heat generated from the imaging element 40.

In this embodiment, the rotation shaft 59 includes: the fixation part 591 that is fixed to the heat dissipating member 90; and the shaft part 592 that extends from the fixation part 591 toward the counter object side L2, and the fixation part 591 includes the flange part 593 that is larger in diameter than the shaft part 592. It is accordingly possible to provide, on the rotation shaft 59, a site with which the heat dissipating member 90 is in contact in the optical axis L direction, and it is therefore possible to transfer heat from this site. Furthermore, the flange part 593 is larger in diameter than the shaft part 592, and therefore has a large contact area with the heat dissipating member 90. It is accordingly possible to increase an amount of heat dissipated. Instead of the configuration in which the rotation shaft 59 is provided with the flange part 593 larger in diameter than the shaft part 592, as illustrated in FIG. 8B, the shaft part 592A may be provided with the stepped part 595A, and the stepped part 595A may be abutted against the heat dissipating member 90 in the optical axis L direction. As illustrated in FIG. 8C, alternatively, the flange part 593B may be provided so as to be abutted against the heat dissipating member 90 from the object side L1.

In this embodiment, since each of the rotation shaft 59 and the rotation seat 50 is a filler-containing resin member, each of the rotation shaft 59 and the rotation seat 50 exhibits high heat conductivity. It is accordingly possible to increase an amount of heat dissipated. It is also possible to enhance the strength of each of the rotation shaft 59 and the rotation seat 50.

The heat dissipating member 90 in this embodiment includes the exposed parts 93 located on the outer circumferential end portion and exposed from the rotation seat 50 and the circuit board 41. It is therefore possible to dissipate heat from the exposed parts 93 and to efficiently dissipate heat generated from the imaging element 40. Furthermore, the exposed parts 93 are provided on all the four sides of the heat dissipating member 90. It is therefore possible to evenly dissipate heat from all the four sides of the heat dissipating member 90. It is hence possible to efficiently dissipate heat.

The heat dissipating member 90 in this embodiment is larger than the imaging element 40 when the heat dissipating member 90 is seen from the optical axis L direction. It is therefore possible to easily superimpose the heat dissipating member 90 on the heat generation position of the imaging element 40. It is accordingly possible to easily dissipate heat.

The optical unit 1 with rolling correction function according to this embodiment includes, as the rolling magnetic driving mechanism 70, the coils 71 that are fixed to the rotation seat 50 on the outer circumferential side of the rotation shaft 59, and the magnets 72 that are fixed to the fixation member 20 and are opposed to the coils 71 in the optical axis L direction. The rolling magnetic driving mechanism 70 can be configured between the rotation seat 50 and the fixation member 20 on the outer circumferential side of the rotation shaft 59. Note that the magnets 72 may be fixed to the rotation seat 50, and the coils 71 may be fixed to the fixation member 20. According to this configuration, it is possible to reduce the space for the rolling magnetic driving mechanism 70.

The optical unit 1 with rolling correction function according to this embodiment is capable of configuring the optical unit 100 with triaxial shake correction function including the shake correction mechanism that corrects shake on the axis orthogonal to the optical axis L of the optical unit 1 with rolling correction function. It is thus possible to efficiently dissipate heat generated from the imaging element 40 in the optical unit 100 with triaxial shake correction function.

(Variation Examples)

Figure 11:
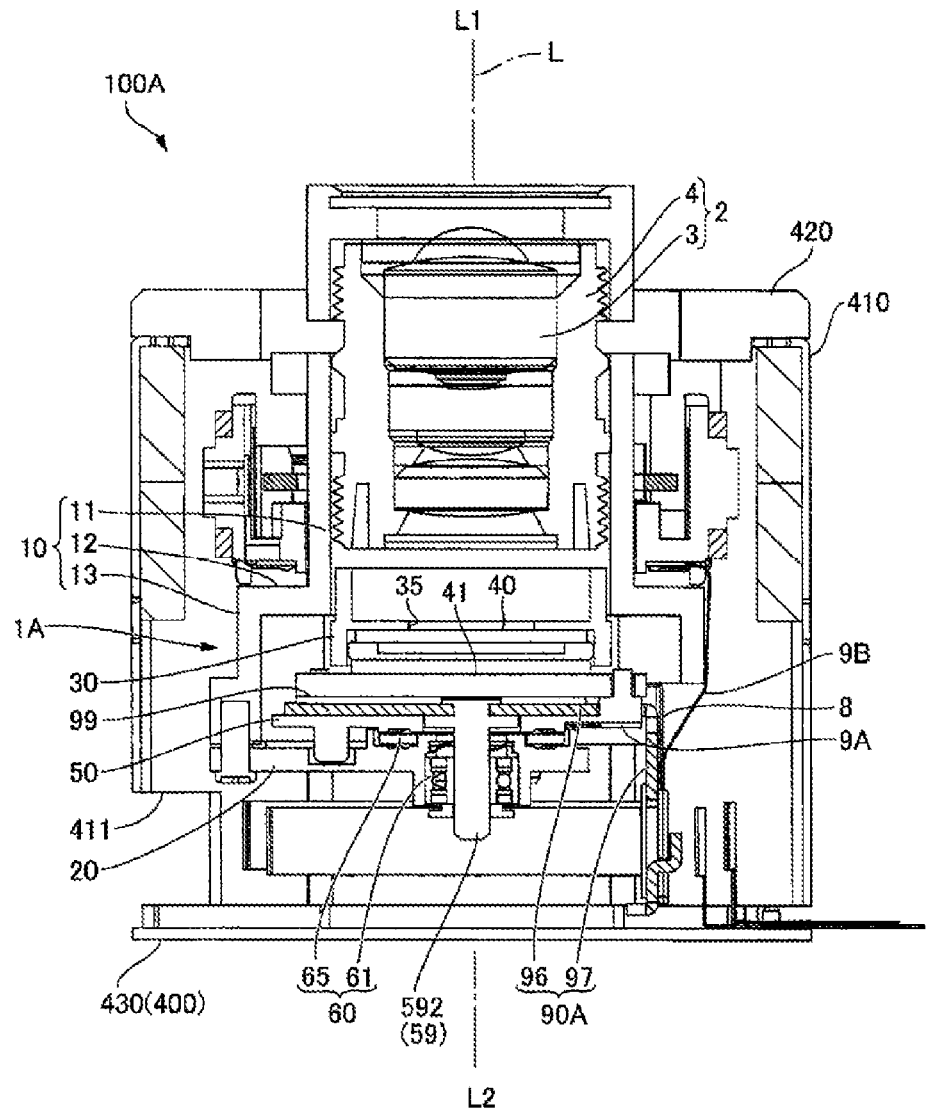
FIG. 11 is a cross-sectional view of an optical unit with triaxial shake correction function in which an optical unit with rolling correction function including a heat dissipating member of a variation example is incorporated.

FIG. 11 is a cross-sectional view of an optical unit 100A with triaxial shake correction function in which an optical unit 1A with rolling correction function including a heat dissipating member 90A of a variation example is incorporated. The following description explains only the difference from the heat dissipating member 90 of the above-described embodiment. The heat dissipating member 90A of the variation example includes: a heat dissipating member main body 96 that is identical in shape to the heat dissipating member 90 of the above-described embodiment; and a protrusion part 97 that is bent at an outer circumferential edge of the heat dissipating member main body 96 toward a counter object side L2 and extends linearly. The protrusion part 97 extends to the counter object side L2 of a fixation member 20, and a tip portion thereof protrudes to the vicinity of a counter object-side casing 430 of a supporting member 400 to serve as a fixation part for fixing a flexible printed circuit board. As described above, it is possible to use the protrusion part 97 as the fixation part for the flexible printed circuit board, and it is therefore possible to achieve increase in amount of heat dissipated and simplification of a structure for fixation of the flexible printed circuit board.

For example, in the optical unit 100A with triaxial shake correction function according to the variation example illustrated in FIG. 11, a flexible printed circuit board 8 that is connected to a circuit board 41, a flexible printed circuit board 9A that supplies power to a coil of a rolling magnetic driving mechanism, and a flexible printed circuit board 9B that supplies power to a coil of a swing magnetic driving mechanism are each drawn in a shape wound around an optical axis L, and a winding start portion of each flexible printed circuit board is fixed to the protrusion part 97.

While the description above refers to particular embodiments of the present disclosure, it will be understood that many modifications may be made without departing from the spirit thereof. The accompanying claims are intended to cover such modifications as would fall within the true scope and spirit of the present disclosure.

The presently disclosed embodiments are therefore to be considered in all respects as illustrative and not restrictive, the scope of the disclosure being indicated by the appended claims, rather than the foregoing description, and all changes which come within the meaning and range of equivalency of the claims are therefore intended to be embraced therein.

What is claimed is:

1. An optical unit with rolling correction function, comprising:
   an optical element;
   an imaging element that is arranged on a counter object side of the optical element;
   a rotation member to which a circuit board and a heat dissipating member are fixed, wherein the circuit board being mounted with the imaging element, and the heat dissipating member being arranged on the counter object side of the circuit board to receive a heat from the circuit board;
   a fixation member that is arranged on the counter object side of the rotation member;
   a rotation supporting mechanism that includes a rotation shaft fixed to the rotation member via the heat dissipating member, and a bearing part provided on the fixation member; and
   a rolling magnetic driving mechanism that causes the rotation member to rotate on an optical axis of the optical element,
   wherein at least a part of the imaging element and at least a part of the heat dissipating member overlap with the rotation shaft at an identical position when the imaging element and the heat dissipating member are seen from an optical axis direction.

2. The optical unit with rolling correction function according to claim 1, wherein
   the circuit board is in contact with the heat dissipating member via a heat conductive layer.

3. The optical unit with rolling correction function according to claim 2, wherein the rotation shaft comprising:
   a fixation part that is fixed to the heat dissipating member, and
   a shaft part that extends from the fixation part toward the counter object side, and wherein the fixation part comprising:
   a projection part that is inserted into a through hole or a depression part in the heat dissipating member, and
   an abutting part that is abutted against the heat dissipating member from the counter object side on an outer circumferential side of the projection part.

4. The optical unit with rolling correction function according to claim 3, wherein
   the abutting part is a flange part that is larger in diameter than the shaft part.

5. The optical unit with rolling correction function according to claim 2, wherein the rotation shaft comprising:
   an abutting part that is abutted against the heat dissipating member from an object side, and
   a shaft part that extends to the counter object side of the heat dissipating member through a through hole in the heat dissipating member.

6. The optical unit with rolling correction function according to claim 1, wherein
   at least one of the rotation shaft and the rotation member is a filler-containing resin member.

7. The optical unit with rolling correction function according to claim 1, wherein
   an outer circumferential end portion of the heat dissipating member has an exposed part that is exposed from the rotation member and the circuit board.

8. The optical unit with rolling correction function according to claim 7, wherein
   the circuit board is in a polygonal shape,
   wherein the heat dissipating member has a plurality of sides respectively extending along sides of the circuit board, and
   wherein the exposed part is provided on each side of the heat dissipating member.

9. The optical unit with rolling correction function according to claim 1, wherein
   the heat dissipating member is larger than the imaging element when the heat dissipating member is seen from the optical axis direction.

10. The optical unit with rolling correction function according to claim 1, wherein the heat dissipating member comprising:
    a heat dissipating member main body that extends parallelly to the circuit board, and
    a protrusion part that extends from an outer circumferential edge of the heat dissipating member main body toward the counter object side.

11. The optical unit with rolling correction function according to claim 1, wherein the rolling magnetic driving mechanism comprising:
    a coil that is fixed to one of the rotation member and the fixation member on an outer circumferential side of the rotation shaft, and
    a magnet that is fixed to the other one of the rotation member and the fixation member and is opposed to the coil in the optical axis direction.

12. An optical unit with triaxial shake correction function, comprising:
    the optical unit with rolling correction function according to claim 1; and
    a shake correction mechanism that corrects shake on an axis orthogonal to the optical axis of the optical unit with rolling correction function.

13. The optical unit with triaxial shake correction function according to claim 12, wherein
    the shake correction mechanism is a swing magnetic driving mechanism that causes the optical unit with rolling correction function to swing on a first axis and a second axis orthogonal to the optical axis, and
    wherein the optical unit with rolling correction function is supported by a gimbal mechanism including a swing supporting part that is arranged at an angular position between the first axis and the second axis, and a movable frame that is supported by the swing supporting part.

* * * * *